US009337719B2

(12) United States Patent
Nakamori et al.

(10) Patent No.: US 9,337,719 B2
(45) Date of Patent: May 10, 2016

(54) POWER CONVERTER CONTROL DEVICE

(71) Applicant: FUJI ELECTRIC CO., LTD., Kawasaki-shi (JP)

(72) Inventors: Akira Nakamori, Matsumoto (JP); Satoru Motohashi, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 65 days.

(21) Appl. No.: 14/506,920

(22) Filed: Oct. 6, 2014

(65) Prior Publication Data

US 2015/0023076 A1 Jan. 22, 2015

Related U.S. Application Data

(63) Continuation of application No. PCT/JP2013/076723, filed on Oct. 1, 2013.

(30) Foreign Application Priority Data

Nov. 6, 2012 (JP) ................................. 2012-244485

(51) Int. Cl.
*H02M 1/32* (2007.01)
*H02M 7/48* (2007.01)
(Continued)

(52) U.S. Cl.
CPC *H02M 1/32* (2013.01); *H02M 7/48* (2013.01); *H02M 7/5387* (2013.01); *H02M 2001/327* (2013.01); *H03K 17/0828* (2013.01); *H03K 17/18* (2013.01)

(58) Field of Classification Search
CPC .......... H02M 1/32; H02M 7/48; H02M 1/34; H02H 3/006; H02H 5/044; H02H 7/1227; H02H 7/48; H03K 2017/0806; H01H 71/7409

USPC .............. 363/55, 56.01, 56.03, 56.04, 56.05; 361/93.1, 103
See application file for complete search history.

(56) References Cited

U.S. PATENT DOCUMENTS 8,125,199 B2 * 2/2012 Tsai ........................ H02M 3/10
323/222
8,779,929 B2 * 7/2014 Komatsu ............ H03K 17/0822
340/584
(Continued)

FOREIGN PATENT DOCUMENTS

JP 10198440 A 7/1998
JP 2000134074 A 5/2000
(Continued)

OTHER PUBLICATIONS

International Search Report issued in PCT/JP2013/076723, mailing date of Jan. 7, 2014. English translation provided.

*Primary Examiner* — Adolf Berhane
(74) *Attorney, Agent, or Firm* — Rossi, Kimms & McDowell LLP

(57) ABSTRACT

A power converter control device includes an alarm signal generation circuit which detects information necessary for a protection operation of a semiconductor element configuring a power converter, and generates and externally outputs an alarm signal with a pulse width responding to a protection factor; a temperature signal generation circuit which detects a temperature of the semiconductor element, and generates a PWM signal, correlated with the temperature, the cycle of which is different from the pulse width of the alarm signal; and an output control circuit which selects the PWM signal in normal time, and selects and externally outputs the alarm signal in place of the PWM signal when the alarm signal is generated.

13 Claims, 9 Drawing Sheets

(51) Int. Cl.
*H02M 7/5387* (2007.01)
*H03K 17/082* (2006.01)
*H03K 17/18* (2006.01)

(56) References Cited

U.S. PATENT DOCUMENTS

| | | | |
|---|---|---|---|
| 2003/0072117 A1* | 4/2003 | Maekawa | H02M 1/08 361/86 |
| 2006/0193091 A1* | 8/2006 | Joukou | H03K 17/0828 361/23 |
| 2011/0317315 A1* | 12/2011 | Motohashi | H02H 7/122 361/18 |
| 2012/0146782 A1* | 6/2012 | Komatsu | H03K 17/0822 340/501 |
| 2014/0009983 A1* | 1/2014 | Nakamori | H02M 1/32 363/50 |
| 2015/0180227 A1* | 6/2015 | Sekigawa | H02M 1/08 361/88 |

FOREIGN PATENT DOCUMENTS

| | | |
|---|---|---|
| JP | 2006079404 A | 3/2006 |
| JP | 2006238546 A | 9/2006 |
| JP | 2011172336 A | 9/2011 |
| JP | 2012143125 A | 7/2012 |

* cited by examiner

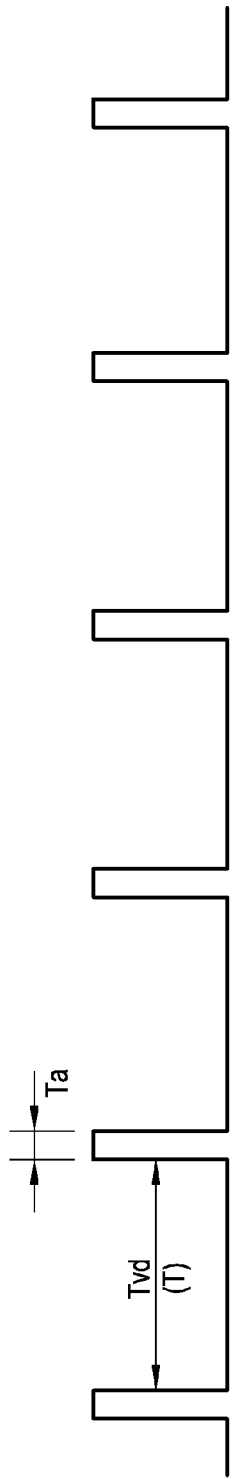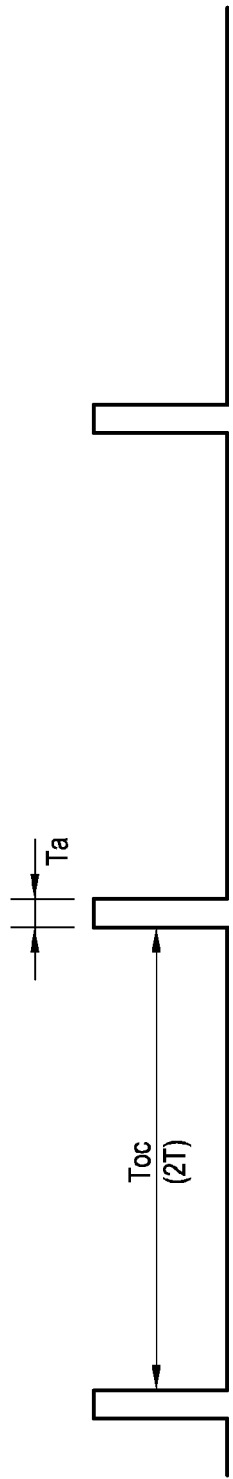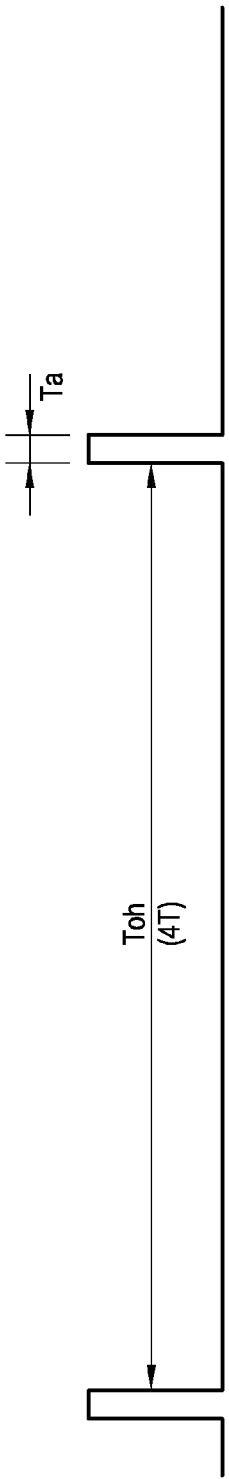

POWER CONVERTER CONTROL DEVICE

CROSS-REFERENCE TO RELATED APPLICATIONS

This application is a continuation of International Application No. PCT/JP2013/076723, filed on Oct. 1, 2013, and is based on and claims priority to Japanese Patent Application No. JP 2012-244485, filed on Nov. 6, 2012. The disclosure of the Japanese priority application and the PCT application in their entirety, including the drawings, claims, and the specification thereof, are incorporated herein by reference.

BACKGROUND

1. Field of the Invention

Embodiments of the present invention relate to a power converter control device, as well as driving a semiconductor element configuring a power converter, that includes the function of protecting the semiconductor element.

2. Discussion of the Background

Recently, attention has been drawn to an intelligent power module (IPM). The intelligent power module is such that protection circuits for protection against anomalies, such as an overcurrent of each semiconductor element, a voltage drop of a control power source, and overheating, are modularized as one electronic component together with a plurality of semiconductor elements formed of, for example, power transistors, such as IGBTs, and with drive circuits which drive the respective semiconductor elements. Also, it is also proposed in, for example, JP-A-2012-143125 (PTL 1) that in addition to the heretofore described plurality of protection circuits which detect the respective anomalies, a notification circuit, which externally outputs an alarm signal with a preset pulse width in response to the type of the anomaly detected by each protection circuit, is mounted in the intelligent power module.

FIG. 8 is a block diagram showing an outline configuration of this kind of power converter control device. The power converter control device 1 includes an inverter 2 which converts direct current power to alternating current power. A plurality of semiconductor elements configuring the inverter 2, in this example, six IGBTs (Insulated Gate Bipolar Transistors) 11 to 16 are individually driven by drive circuits 3U to 3Z, respectively. Reference numerals 21 to 26 in FIG. 8 denote free wheeling diodes connected in reverse parallel, one between the emitter and collector of each respective IGBT 11 to 16.

The six IGBTs 11 to 16 configuring the inverter 2, by being connected in series by twos, configure three sets of half bridge circuits. The half bridge circuits are interposed between a positive terminal P and negative terminal N connected to an unshown direct current power supply. The three sets of half bridge circuits provided in parallel configure a three-phase full bridge circuit which converts direct current power, supplied between the positive terminal P and the negative terminal N, to three-phase alternating current power. The three-phase alternating current power converted by the inverter 2 is supplied to an alternating current load 4 such as an electric motor.

More particularly, the IGBTs 11, 12, and 13, of the six IGBTs 11 to 16 configuring the inverter 2, which are connected to the positive terminal P side, configure upper arms which generate respective positive U-phase, V-phase, and W-phase powers of three-phase alternating current. Also, the IGBTs 14, 15, and 16 connected to the negative terminal N side configure lower arms which generate respective negative X-phase, Y-phase, and Z-phase powers of three-phase alternating current. The IGBTs 11 to 16 switch the direct current power by being on/off driven in mutually different phases by the drive circuits 3U to 3Z. Further, the IGBTs 11 to 16 output the three phase alternating current powers from the series connection points of th IGBTs 11 to 16 via output terminals U, V, and W.

Also, each of the drive circuits 3U to 3Z, as FIG. 9 shows an outline configuration of the drive circuit 3X as a representative drive circuit, includes a gate control circuit 31 which inputs a control signal Sm given from an unshown inverter control section and on/off controls the gate of the IGBT 14. The control signal Sm is formed of pulse signals which are pulse width modulated (PWMed) in the inverter control section under phase controls responding to the respective U- to Z-phases.

A protection signal (drive stop signal) Sp is input into the gate control circuit 31 from a protection signal generation circuit 35 to be described hereafter. When the protection signal Sp is off (at an H level), the gate control circuit 31 applies the control signal Sm to the gate of the IGBT 14 and on/off drives the IGBT 14. Also, when the protection signal Sp is on (at an L level), the gate control circuit 31 prevents the control signal Sm from passing. The drive of the IGBT 14 is inhibited by the prevention of the control signal Sm from passing, thereby protecting the IGBT 14 against an anomaly.

Also, the drive circuit 3X includes a control voltage detection circuit 32, a current detection circuit 33, and a temperature detection circuit 34 as the plurality of protection circuits which realize the function of protecting the IGBT 14. The control voltage detection circuit 32 includes a first comparator CP1 which compares a control voltage Vcc of the drive circuit 3U supplied from an external power supply and a preset first threshold voltage Vth1. When the control voltage Vcc drops to and below the first threshold voltage Vth1, the control voltage detection circuit 32 formed of the first comparator CP1 detects this drop as an anomalous drop of the control voltage Vcc and outputs an H-level voltage anomaly detection signal Svd.

Also, the current detection circuit 33 includes a second comparator CP2 which compares a voltage Vi indicating a current I, flowing through the IGBT 14, which is detected from the current detection emitter of the IGBT 14 and a preset second threshold voltage Vth2. When the voltage Vi exceeds the second threshold voltage Vth2, the current detection circuit 33 formed of the second comparator CP2 detects this excess as an overcurrent and outputs an H-level overcurrent anomaly detection signal Soc.

Furthermore, the temperature detection circuit 34 includes a third comparator CP3 which compares a voltage Vt indicating a temperature T of the IGBT 14 detected by a temperature detection diode 18 acting as a temperature sensor mounted in a semiconductor chip which is the same as the IGBT 14, specifically, the temperature T of the semiconductor chip in which the IGBT 14 is formed, and a preset third threshold voltage Vth3. When the voltage Vt drops below the third threshold voltage Vth3, the temperature detection circuit 34 formed of the third comparator CP3 detects this drop as overheat and outputs an H-level overheat anomaly detection signal Soh.

When one of the detection circuits 32, 33, and 34 outputs its respective anomaly detection signal Svd, Soc, and Soh, the protection signal generation circuit 35 is biased via an OR circuit 36 to generate the protection signal Sp of the L level over a fixed time and gives the protection signal Sp of the L level to the gate control circuit 31. Also, the protection signal Sp of the L level is also given to the other drive circuits 3Y and 3Z via a terminal AE. By so doing, not only the drive of the IGBT 14, but also the drives of the remaining IGBTs 15 and 16 are inhibited by the protection signal Sp of the L level.

The anomaly detection signals Svd, Soc, and Soh output by the detection circuits 32, 33, and 34, respectively, are given to an alarm signal generation circuit 37. The alarm signal generation circuit 37 generates alarm signals when given the anomaly detection signals Svd, Soc, and Soh from the detection circuits 32, 33, and 34. The alarm signals are formed one of each of pulse signal trains, with mutually different pulse widths Tvd, Toc, and Toh, in each of which the pulse signals string with a predetermined pulse interval Ta spaced from one another and which are correlated in advance to the respective detection circuits 32, 33, and 34, as shown in, for example, FIGS. 10A, 10B, and 10C, respectively. Incidentally, the respective pulse widths Tvd, Toc, and Toh of the pulse signal trains forming the alarm signals are set to be, for example, Tvd (=T), Toc (=2T), and Toh (=4T). Further, the alarm signals formed of the pulse signal trains are externally output via an output transistor 38, thus contributing to generation of the control signal Sm. The control signal Sm is given to the inverter control section and used to drive the drive circuit 3X.

In recent years, from the viewpoint of energy management, there is a mounting demand for wanting to constantly monitor the temperatures of the IGBTs 11 to 16 which are semiconductor elements in the intelligent power module (IPM). However, the number of output terminals increases in the IPM in order to individually detect and externally output the temperatures of a plurality of semiconductor elements. Furthermore, there arises a problem that a processing burden in the inverter control section increases. As a technique to solve this kind of problem, it is proposed in, for example, JP-A-2000-134074 (PTL 2) to individually detect the temperatures of the plurality of semiconductor elements and select and externally output highest temperature information of these items of temperature information.

However, according to the technique introduced in PTL 2, it is necessary to collect items of temperature information, detected by a plurality of temperature sensors, via an analogue insulation amplifier. Moreover, as analogue voltages indicating the items of temperature information are externally output, the configuration of a processing circuit therefor is complicated, thus undeniably triggering a cost increase. Furthermore, it is necessary to provide dedicated output terminals, specifically, analogue ports for externally outputting the items of temperature information in addition to output terminals, specifically, digital ports from which to externally output the alarm signals. Hence, it is undeniable that the number of output terminals of the semiconductor module (IPM) increases.

SUMMARY

Embodiments of the invention provide a power converter control device of a simple configuration wherein it is possible, utilizing the output terminals from which to externally output the alarm signals, to externally output the items of temperature information of the semiconductor elements without preventing the output of the alarm signals and so that the items of temperature information can be clearly distinguished from the alarm signals.

A power converter control device according to an embodiment of the invention includes a drive circuit which drives a semiconductor element configuring a power converter; a plurality of protection circuits, each of which detects information necessary for a protection operation of the semiconductor element, generates a protection signal, and in accordance with the protection signal, stops the drive of the semiconductor element by the drive circuit; and an alarm signal generation circuit which, in response to an output of each protection circuit, generates and externally outputs an alarm signal with a pulse width responding to a protection factor, and particularly, by including a temperature signal generation circuit which detects a temperature of the semiconductor element, and generates a PWM signal, correlated with the temperature, the cycle of which is different from the pulse width of the alarm signal; and an output control circuit which selects the PWM signal in normal time, and selects and externally outputs the alarm signal in place of the PWM signal when the alarm signal is generated.

A power converter control device according to an embodiment of the invention includes a plurality of drive circuits which drive a plurality of respective semiconductor elements configuring a power converter; a plurality of protection circuits, provided so as to correspond to the plurality of respective semiconductor elements, each of which detects information necessary for a protection operation of each of the semiconductor elements, generates a protection signal, and in accordance with the protection signal, stops the drive of the semiconductor element by the drive circuit; and alarm signal generation circuits, provided so as to correspond to the respective semiconductor elements, each of which, in response to an output of each corresponding protection circuit, generates and externally outputs an alarm signal with a pulse width responding to a protection factor, and particularly, by including temperature signal generation circuits, each of which detects a temperature of each respective semiconductor element, and generates a PWM signal, correlated with the temperature, the cycle of which is different from the pulse width of the alarm signal; and output control circuits, each of which selects the PWM signal in normal time, and selects and externally outputs the alarm signal in place of the PWM signal when the alarm signal is generated.

Specifically, the plurality of protection circuits are formed of circuits which include a voltage detection circuit which detects a control voltage applied to the control device, a temperature detection circuit which detects a temperature of the semiconductor element, and a current detection circuit which detects a current flowing through the semiconductor element, and generate respective protection signals for low voltage protection, overheat protection, and overcurrent protection.

The temperature signal generation circuit may be configured so as to generate no PWM signal when the temperature of the semiconductor is lower than a set temperature, and generate a PWM signal responding to the temperature of the semiconductor element only when the temperature of the semiconductor element is equal to or higher than the set temperature. Also, it is desirable to configure the temperature signal generation circuit so as to generate a PWM signal responding to the temperature of the semiconductor element while defining at least one of the upper limit or lower limit of a duty of the PWM signal.

Also, the output control circuit may be formed of a multiplexer which selects and outputs the alarm signal over the period in which the alarm generation circuit is generating an alarm signal, and selects and outputs the PWM signal in place of the alarm signal when the generation of the alarm signal stops. In particular, the multiplexer may be configured so that the multiplexer, in accordance with a switching signal generated by delaying the trailing edge of the alarm signal, is operation controlled to select and output the PWM signal.

Furthermore, for example, the plurality of drive circuits may be formed into integrated circuits with the plurality of respective protection circuits and alarm signal generation circuits corresponding to the plurality of respective semiconductor elements configuring the power converter, and that the temperature signal generation circuit is formed into an integrated circuit with the output circuit independently from the plurality of drive circuits. In this case, it is desirable to configure the temperature signal generation circuit so as to select a highest temperature of a plurality of the detected temperatures and generate a PWM signal correlated with the highest temperature.

According to the power converter control device of the heretofore described configuration, the PWM signal responding to the detected temperature of the semiconductor element and the alarm signal with the pulse width responding to, for example, an anomaly factor are selected and externally output using a common output terminal. Further, the PWM signal can be steadily output in normal operation time when the alarm signal is not output. Consequently, it is not necessary to newly provide an output terminal for outputting the PWM signal. Also, as the cycle of the PWM signal is made different from the pulse interval of the alarm signal, it is also possible, preferably, by setting the cycle of the PWM signal to be shorter than a minimum pulse interval of the alarm signal, to make it easy to distinguish between the PWM signal and the alarm signal.

In particular, according to embodiment(s) of the invention, the selection and output of the alarm signal are given preference over those of the PWM signal, and in accordance with a switching signal generated by delaying the trailing edge of the alarm signal, the PWM signal is selected and output in place of selecting and outputting the alarm signal. Consequently, it does not happen that the alarm signal itself is prevented from being output, and it is possible to prevent an incorrect identification of the alarm signal from occurring. Also, it is possible, by sharing the output terminal of the alarm signal, to output the PWM signal correlated with the temperature of the semiconductor element while maintaining the function of outputting the alarm signal. Consequently, the practical advantage of the power converter control device is immense.

BRIEF DESCRIPTION OF DRAWINGS

FIGS. 10A, 10B, and 10C are diagrams showing examples of alarm signals with pulse widths responding to protection factors.

DESCRIPTION OF ILLUSTRATED EMBODIMENTS

Figure 1:
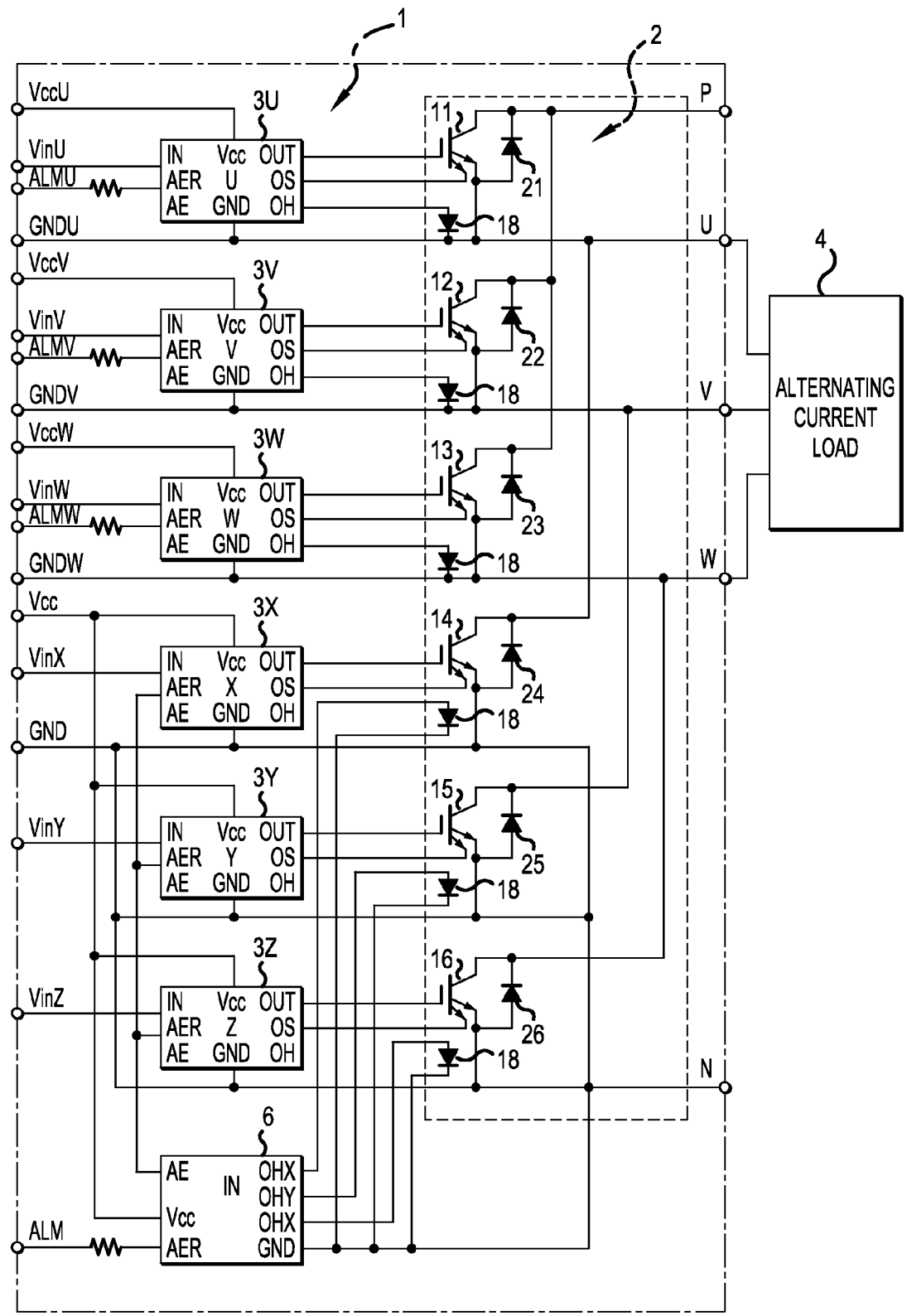
FIG. 1 is an outline configuration diagram of a power converter control device according to one embodiment of the invention.

Hereafter, a description will be given, referring to the drawings, of a power converter control device according to an embodiment of the invention.

Figure 8:
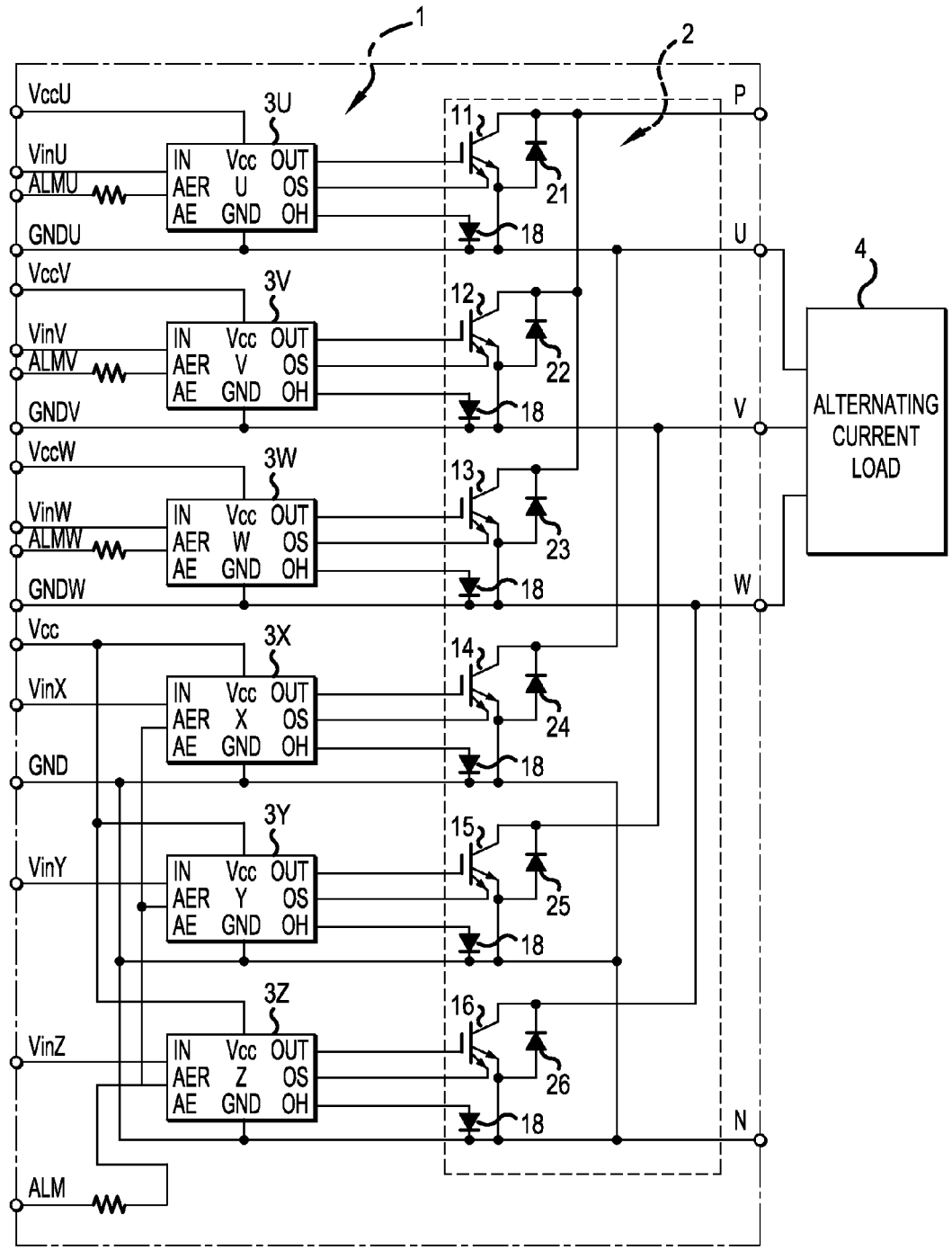
FIG. 8 is an outline configuration diagram of a common power converter control device.

FIG. 1 is a block diagram showing an outline configuration of a power converter according to an embodiment of the invention. The power converter control device 1, as well as including an inverter 2 which converts direct current power to alternating current power, includes six drive circuits 3U to 3Z which individually drive six semiconductor elements, for example, IGBTs 11 to 16 configuring the inverter 2, basically in the same way as the control device 1 shown in FIG. 8. The drive circuits 3U to 3Z may be configured basically in the same way as the previously described ones shown in FIG. 9, and consequently, a detailed description thereof will be omitted. Furthermore, the control device 1 includes a temperature signal output circuit 6, apart from the drive circuits 3U to 3Z. Further, the control device 1 is characterized by being configured so that the temperature signal output circuit 6 detects temperatures of the IGBTs 14, 15, and 16 configuring the lower arms of the previously described three sets of half bridge circuits in the inverter 2, and generates PWM signals correlated with the detected temperatures.

Figure 9:
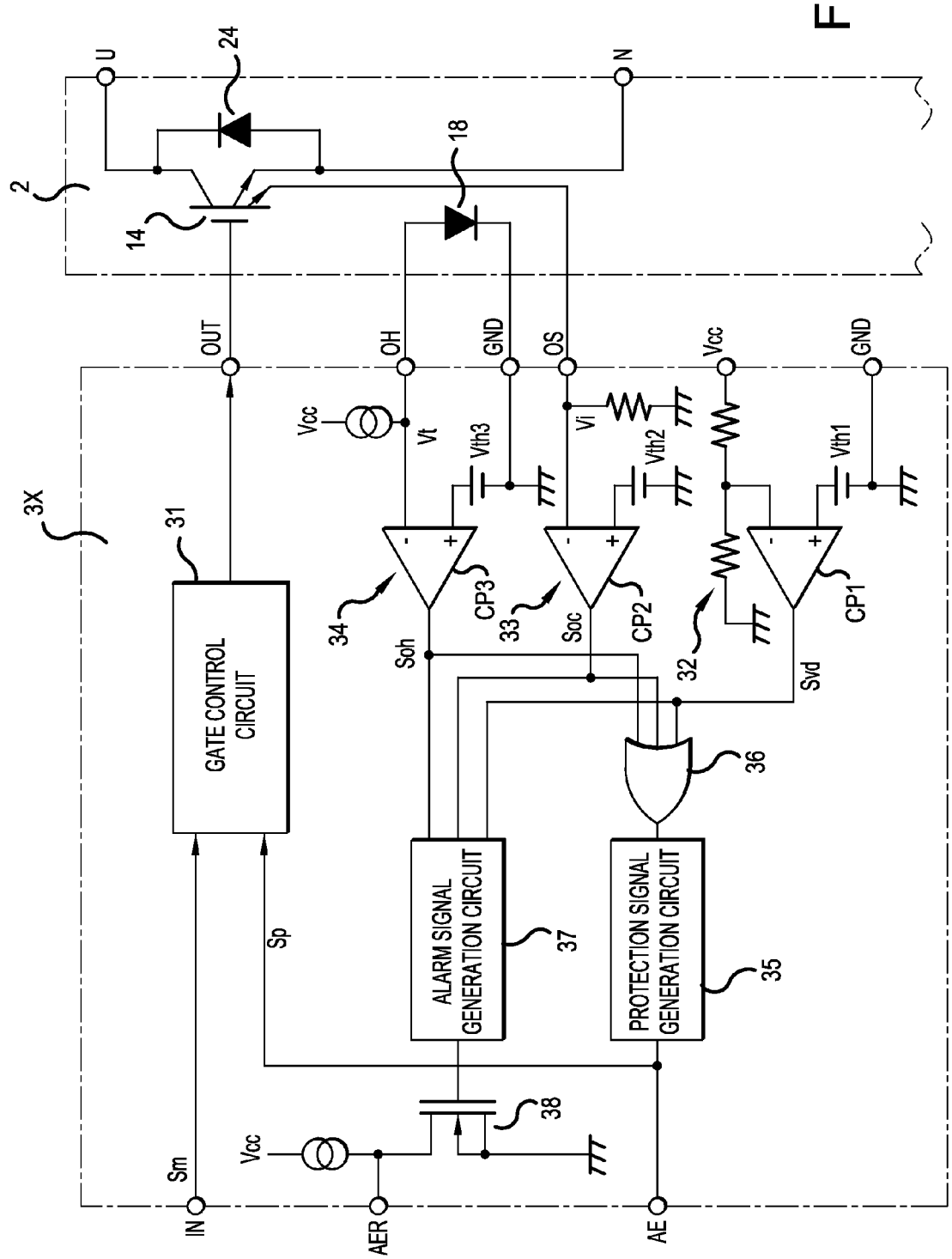
FIG. 9 is an outline configuration diagram of a drive circuit in the control device shown in FIG. 8.

That is, the control device 1 includes three drive circuits 3U, 3V, and 3W which drive the respective IGBTs 11, 12, and 13 configuring the upper arms of the three sets of half bridge circuits in the inverter 2. The drive circuits 3U, 3V, and 3W, as shown in FIG. 9, each detect a control voltage applied to each respective drive circuit 3U (3V, 3W) by each respective previously described detection circuit 32, 33, and 34, a temperature of each respective IGBT 11 (12, 13), and a current flowing through each respective IGBT 11 (12, 13). Further, each of the drive circuits 3U, 3V, and 3W, in accordance with the detected items of information, generates protection signals for low voltage protection, overheat protection, and overcurrent protection, and generates and externally outputs alarm signals with pulse widths responding to the types of anomalies.

Also, the control device 1 includes three drive circuits 3X, 3Y, and 3Z which drive the respective IGBTs 14, 15, and 16 configuring the lower arms of the three sets of half bridge circuits. The drive circuits 3X, 3Y, and 3Z are used without being connected to the previously described temperature detection diodes 18 provided pertaining to the respective IGBTs 14, 15, and 16. The drive circuits 3X, 3Y, and 3Z each detect a control voltage applied to each respective drive circuit 3X (3Y, 3Z) from each respective detection circuit 32, 33, and 34, and a current flowing through each respective IGBT 14 (15, 16). In other words, the drive circuit 3X (3Y, 3Z) does not detect the temperature of the IGBT 11 (12, 13), unlike the drive circuit 3U (3V, 3W). Further, the drive circuit 3X (3Y, 3Z) generates protection signals for low voltage protection and overcurrent protection, and generates and externally outputs alarm signals with pulse widths responding to the types of anomalies.

The temperature detection diodes 18 provided pertaining to the respective IGBTs 14, 15, and 16 are connected to the temperature signal output circuit 6, rather than to the drive circuits 3X, 3Y, and 3Z. Consequently, the temperature detection diodes 18 give items of information, one indicating each of the respective temperatures of the IGBTs 14, 15, and 16, in parallel to the temperature signal output circuit 6.

Figure 2:
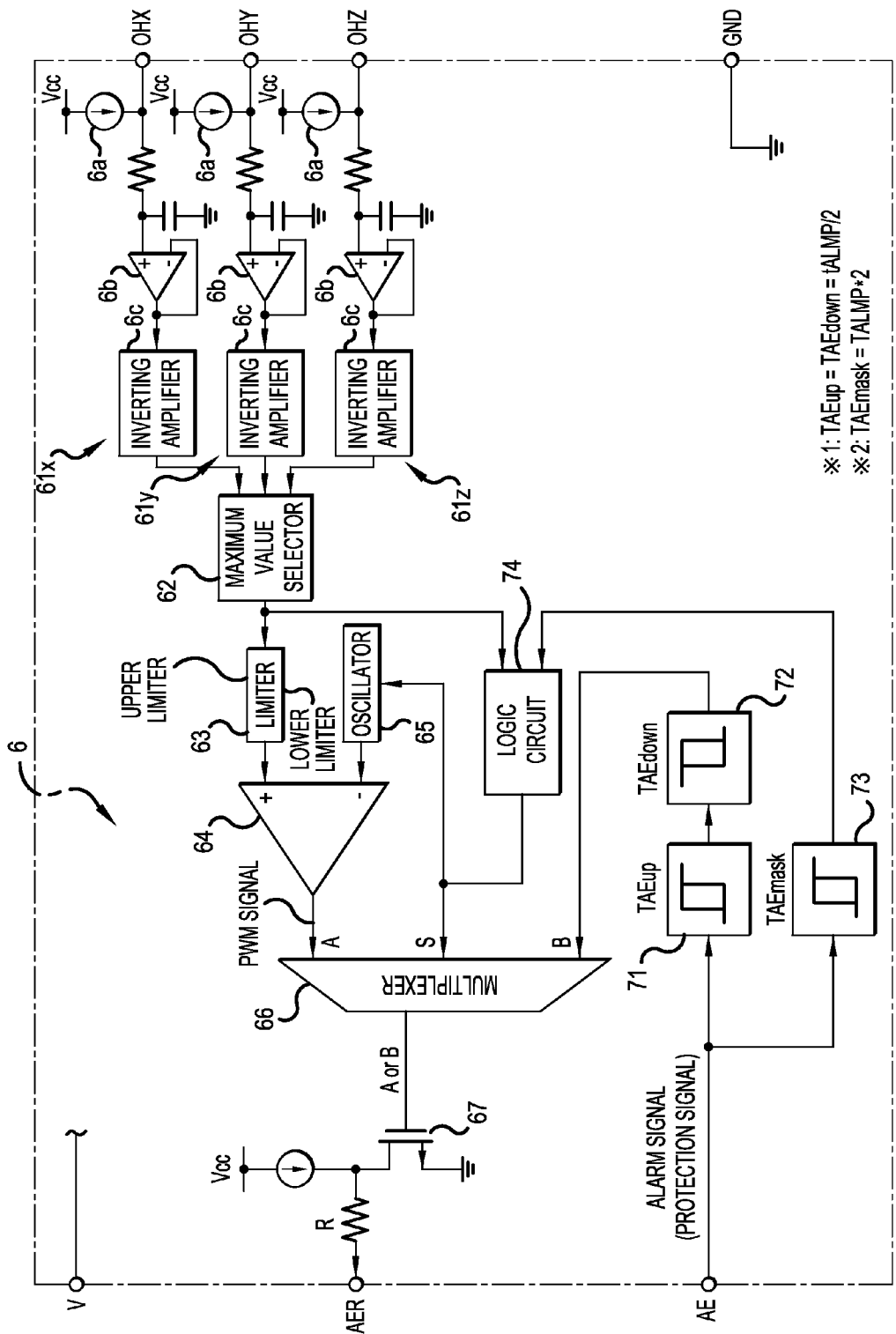
FIG. 2 is an outline configuration diagram of a temperature signal output circuit in the control device shown in FIG. 1.

Now, the temperature signal output circuit 6, as an outline configuration thereof is shown in, for example, FIG. 2, includes three temperature detection circuits 61$x$, 61$y$, and 61$z$ provided in parallel. The temperature detection circuits 61$x$, 61$y$, and 61$z$ detect the temperatures of the IGBTs 14, 15, and 16 via the temperature detection diodes 18 provided pertaining to the IGBTs 14, 15, and 16, respectively, as previously described.

Incidentally, each temperature detection circuit 61$x$ (61$y$, 61$z$) includes a constant current source 6$a$ which constant current drives the temperature detection diode 18, an input buffer 6$b$ which detects a terminal voltage OHX (OHY, OHZ) of the temperature detection diode 18 which varies according to the temperature of the IGBT 14 (15, 16), and an inverting amplifier 6$c$ which inverts an output of the input buffer 6$b$. Incidentally, the terminal voltage OHX (OHY, OHZ) of the temperature detection diode 18 drops in inverse proportion to a rise in the temperature of the IGBT 14 (15, 16). Consequently, the inverting amplifier 6$c$ assumes the role of, by inverting the output of the input buffer 6$b$, increasing the output voltage of the temperature detection circuit 61$x$ (61$y$, 61$z$) in proportion to a rise in the temperature of the IGBT 14 (15, 16).

Also, the temperature signal output circuit 6 includes a maximum value selector 62 which selects a maximum value (a highest temperature) of voltages proportional to the respective temperatures output from the three temperature detection circuits 61$x$, 61$y$, and 61$z$. Further, a voltage indicating the highest temperature selected via the maximum value selector 62 is given to a comparator 64 after having been clamped via a limiter 63 which defines the upper limit and lower limit of the voltage. The comparator 64 assumes a role as a PWM converter which generates a PWM signal correlated with the heretofore described temperature by comparing the voltage proportional to the temperature and a predetermined cycle of triangular wave voltage signal output by an oscillator 65.

The limiter 63 limits the output voltage of the maximum value selector 62 to a voltage equivalent to a temperature in a temperature region, for example, a temperature region of 60 to 250° C., in which it is necessary to monitor the temperature of the IGBT 14 (15, 16) in an on/off operation condition. The temperature region to be monitored includes an anomalous overheat temperature region. The duty variation width of the PWM signal generated by the comparator 64 is correlated to the temperature region to be monitored, by an output voltage function of the limiter 63. The accuracy and detection range (dynamic range) of temperature detection are secured by the correlation.

The cycle of the triangular wave voltage signal which is output by the oscillator 65, thus contributing to the generation of the PWM signal by the comparator 64, is set to be sufficiently short compared with pulse widths Tvd, Toc, and Toh responding to the types of anomalies of the alarm signals, in particular, compared with the smallest pulse width Tvd (=T). Further, the comparator 64, by comparing this kind of triangular wave voltage signal and the voltage indicating the temperature and inverting the comparison output, generates a constant cycle of PWM signal whose pulse width (duty) varies in such a way as to correlate with the temperature.

The PWM signal, correlated with the temperature, which is generated by the comparator 64 in this way is given to a first input terminal A of a multiplexer 66 which is a 2-input selection type output control circuit, to be described hereafter, and is output via the multiplexer 66 and applied to the gate of an output transistor (MOS-FET) 67. Further, the PWM signal is externally output, via an output terminal AER, as a change in drain voltage resulting from an on/off operation of the output transistor (MOS-FET) 67.

The alarm signal output from each of the drive circuits 3X, 3Y, and 3Z is input into the temperature signal output circuit 6 via a terminal AE. The alarm signal input via the terminal AE is output via a first rise delay circuit 71 and a fall delay circuit 72 in order. Then, the rise timing and fall timing of the alarm signal are delayed by [TAEup] and [TAEdown], respectively, as will be described hereafter. The delayed alarm signal is given to a first input terminal B of the multiplexer (output control circuit) 66, and is output, in place of the PWM signal, via the multiplexer 66.

Also, the alarm signal input from the terminal AE, at the same time as being given to the first rise delay circuit 71, is input into a second rise delay circuit 73. Further, the alarm signal is controlled so that the rise timing thereof is delayed by [TAEmask], as will be described hereafter, and is given to a logic circuit 74. The logic circuit 74 assumes the role of generating a binary switching signal which controls a selection operation of the multiplexer 66 in accordance with the alarm signal delay controlled by the second rise delay circuit 73 and with the output of the maximum value selector 62.

Specifically, the logic circuit 74 compulsorily sets the switching signal to an L level when the signal given from the second rise delay circuit 73 is at the L level. Also, the logic circuit 74 sets the switching signal to an H level when the signal given from the second rise delay circuit 73 is at the H level, and the output voltage of the maximum value selector 62 is equal to or higher than a set voltage indicating a preset temperature. Further, the logic circuit 74 controls the selection operation of the multiplexer 66 by applying the switching signal, generated in the way heretofore described, to a control terminal S of the multiplexer 66. At the same time, the logic circuit 74 controls an oscillation operation of the oscillator 65 by giving the switching signal to the oscillator 65.

The multiplexer 66 selects the second input terminal B when operation controlled by the switching signal, applied to the control terminal S thereof, and thus given the L-level switching signal. As a result of this, the multiplexer 66 selects and outputs an alarm signal, whose timing is adjusted, via the first rise delay circuit 71 and fall delay circuit 72 in order. Also, the multiplexer 66 selects the first input terminal A when given the H-level alarm signal, and selects and outputs the PWM signal generated by the comparator 64. As a result of this, the multiplexer 66 alternatively selects one of the respective signals applied to the first and second input terminals A and B. The series of these operations allows the multiplexer 66 to selectively switch between the alarm signal and the PWM signal and output one.

Also, the oscillator 65 is configured so as to oscillate only when the switching signal is at the H level. Incidentally, the H-level switching signal is output only when the output voltage (temperature) of the maximum value selector 62 indicates that it is equal to or higher than the preset temperature, as heretofore described. The preset temperature is a lowest temperature, in the temperature region in which it is necessary to monitor the temperature of the IGBT 14 (15, 16) and it may be, for example, 60° C. Consequently, only when the temperature of the IGBT 14 (15, 16) rises to the temperature region to be monitored, and there is no input of the alarm signal, the oscillator 65 oscillates to generate the triangular wave voltage signal, thus contributing to the generation of the PWM signal.

Figure 3:
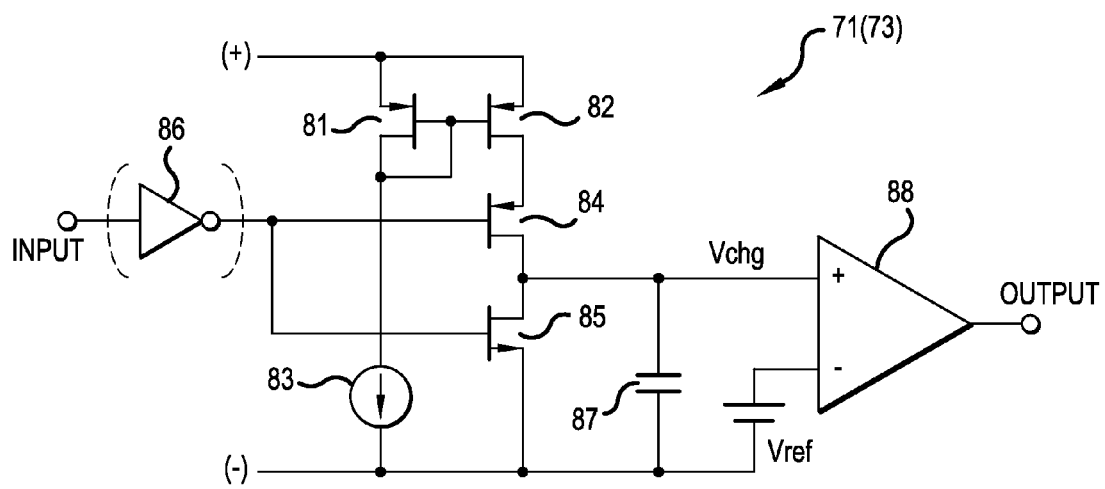
FIG. 3 is a diagram showing a configuration example of a rise delay circuit.

Herein, a description will be given of the first and second rise delay circuits 71 and 73 and the fall delay circuit 72. FIG. 3 shows a configuration example of the rise delay circuit 71

(73). The rise delay circuit 71 (73) includes a current mirror circuit, configured of a pair of p channel FETs 81 and 82 whose gates are connected to each other, which is driven by a constant current source 83 to output from the p channel FET 82 a current proportional to a constant current flowing through the p channel FET 81. Furthermore, the rise delay circuit 71 (73) includes a totem pole switch circuit, configured of a p channel FET 84 and n channel FET 85 whose sources are connected to each other and whose gates are connected to each other, to which a constant current is supplied via the current mirror circuit. The p channel FET 84 and n channel FET 85 turn on reciprocally in response to an input signal applied to the gates via a NOT circuit 86.

Specifically, when the input signal is at the H level, and the L-level signal is applied to the respective gates of the p channel FET 84 and n channel FET 85 via the NOT circuit 86, the p channel FET 84 turns on, and the n channel FET 85 turns off. Conversely, when the input signal is at the L level, and the H-level signal is applied to the respective gates of the p channel FET 84 and n channel FET 85 via the NOT circuit 86, the p channel FET 84 turns off, and the n channel FET 85 turns on.

A capacitor 87 is connected to the connection point of the p channel FET 84 and n channel FET 85, totem pole connected, which turn on reciprocally, as heretofore described. The p channel FET 84 assumes the role of, when the input signal is at the H level, turning on and thereby charging the capacitor 87 with a constant current. The terminal voltage (a charge voltage Vchg) of the capacitor 87 rises at a constant rise rate owing to the charge of the capacitor 87 resulting from the turning on of the p channel FET 84. Also, the n channel FET 85 assumes the role of, when the input signal is at the L level, turning on and thereby discharging electric charge with which the capacitor 87 is charged. The terminal voltage (charge voltage Vchg) of the capacitor 87 becomes zero (0) owing to the discharge of the capacitor 87 resulting from the turning on of the n channel FET 85.

Further, the charge voltage Vchg of the capacitor 87 taking on this kind of change is compared with a reference voltage Vref in the comparator 88. The comparator 88 outputs a signal which switches to the H level when the charge voltage Vchg exceeds the reference voltage Vref, and which switches to the L level when the charge voltage Vchg is lower than the reference voltage Vref. The output of the comparator 88 is an output signal of the rise delay circuit 71 (73).

Figure 4:
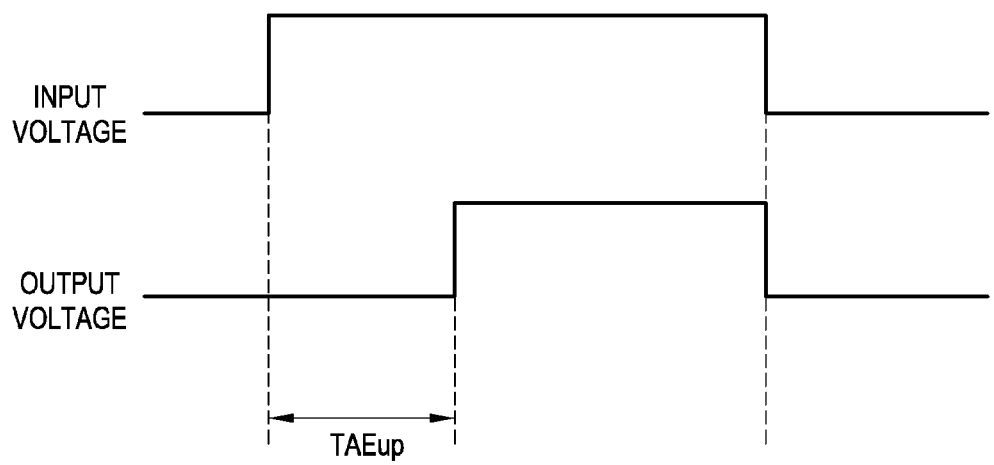
FIG. 4 is a signal waveform diagram showing an operation of the rise delay circuit shown in FIG. 3.

Consequently, according to the rise delay circuit 71 (73) configured in this way, as FIG. 4 shows a relationship between the input and output signals of the rise delay circuit 71 (73), the output signal is inverted to the H level so as to be delayed by the time TAEup needed from the timing at which the input voltage has been inverted to the H level until the charge voltage Vchg of the capacitor 87 reaches the reference voltage Vref. Further, the output voltage of the rise delay circuit 71 (73) is inverted to the L level at the timing at which the input voltage is inverted to the L level. Therefore, by passing through the rise delay circuit 71 (73), the input signal thereof is output with only the rise timing being delayed. Specifically, in the case of the alarm signal, it is output with only the timing, at which the trailing edge of the alarm signal is inverted to the H level, being delayed.

A configuration may be such as to omit the NOT circuit 86 and apply the input signal directly to the gates of the p channel FET 84 and n channel FET 85. By so doing, the capacitor 87 is charged with a constant current when the input voltage is at the L level, and electric charge with which the capacitor 87 is charged is discharged when the input voltage is at the H level. Consequently, the output voltage of the comparator 88 is inverted to the H level at the timing at which the input voltage is inverted to the H level, and is inverted to the L level so as to be delayed by the time TAEdown after the input voltage has been inverted to the L level. Therefore, it is possible to configure the fall delay circuit 72 in the same way by omitting the NOT circuit 86.

Figure 5:
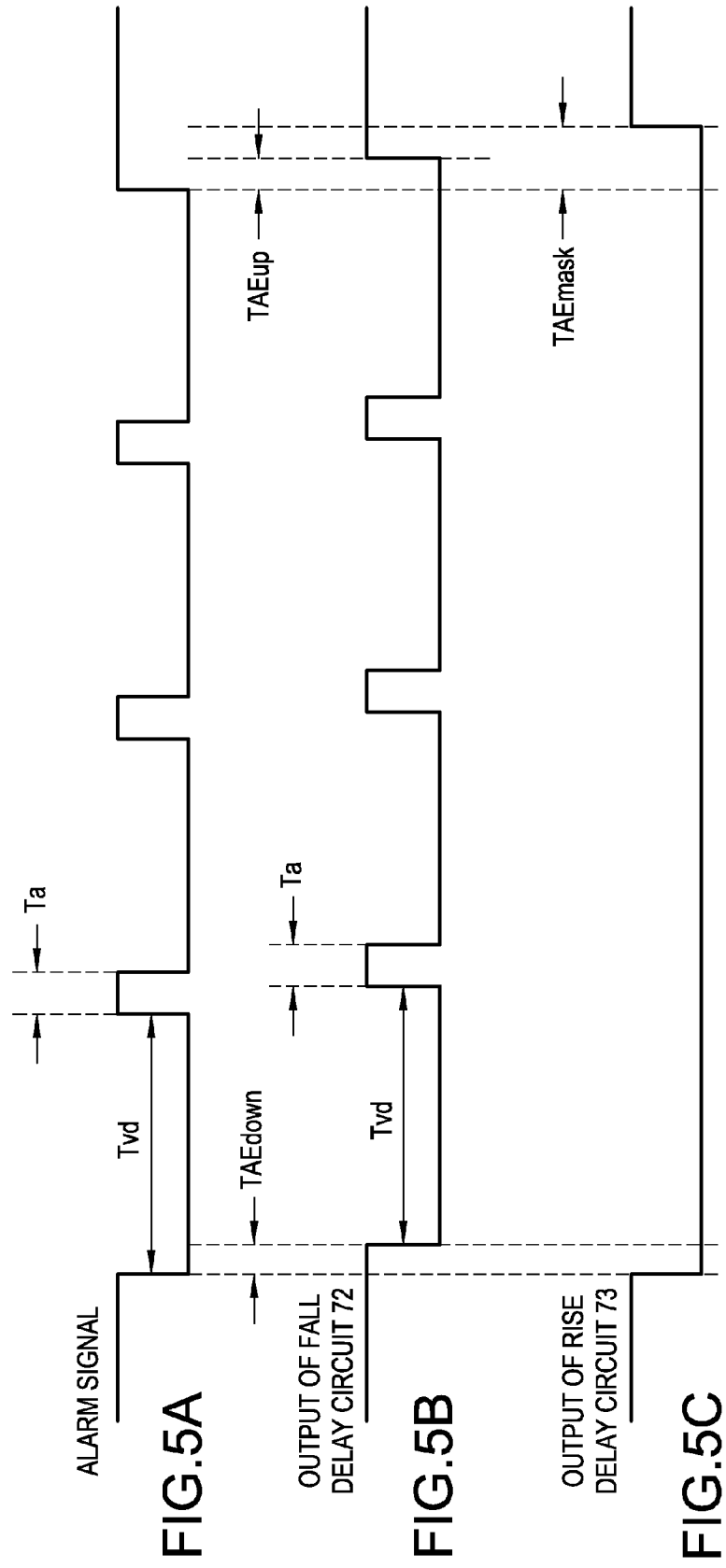
FIGS. 5A, 5B, and 5C are signal waveform diagrams showing a control operation of a multiplexer in a temperature detection circuit shown in FIG. 2.

Herein, to return to the description of the temperature signal output circuit 6, the alarm signal input via the terminal AE is formed of a kind of pulse signal train shown in FIG. 5A wherein L-level pulse signals with the pulse width Tvd (Toc, Toh) responding to a protection factor string so as to be spaced a predetermined time interval Ta from one another, as described referring to FIG. 10A. Further, the alarm signal is output via the first rise delay circuit 71 and fall delay circuit 72 in order. Then, when the delay times TAEup and TAEdown of the rise delay circuit 71 and fall delay circuit 72 are equal to each other, the output signal thereof is a signal wherein the alarm signal is delayed by the time TAEup (=TAEdown), as shown in FIG. 5B.

In other words, a signal given to the second input terminal B of the multiplexer 66 via the rise delay circuit 71 and fall delay circuit 72 in order is such that the fall timing which is the leading edge of the alarm signal is delayed by the time TAEdown. Furthermore, the signal given to the second input terminal B is a signal whose rise timing which is the trailing edge of the alarm signal is delayed by the time TAEup, that is, a signal wherein the alarm signal is delayed by the time TAEup (=TAEdown).

As opposed to this, a signal given to the logic circuit 74 is such that the alarm signal is output via only the second rise delay circuit 73. Consequently, the signal output via the second rise delay circuit 73 is a signal which is inverted to the L level at the timing of the leading edge of the alarm signal, and inverted to the H level at the timing at which the trailing edge of the alarm signal is delayed by the time TAEmask, as shown in FIG. 5C.

By setting the delay time TAEmask of the second rise delay circuit 73 to be longer than the pulse interval Ta of the alarm signal (TAEmask>Ta), it is possible to mask an H-level period indicating the pulse signal interval Ta of the pulse signal train forming the alarm signal. That is, the second rise delay circuit 73 charges the capacitor 87 via the p channel FET 84 at the timing at which the alarm signal is inverted to the H level. However, the delay time TAEmask of the second rise delay circuit 73 is set to be longer than the pulse interval Ta of the alarm signal (TAEmask>Ta). Consequently, the alarm signal is inverted to the L level before the charge voltage Vchg of the capacitor 87 reaches the reference voltage Vref by the capacitor 87 being charged.

As a result of this, as the n channel FET 85 turns on, and electric charge with which the capacitor 87 is charged is discharged, it does not happen that the charge voltage Vchg of the capacitor 87 reaches the reference voltage Vref, and consequently, the output of the comparator 88 is kept at the L level. Therefore, even when the alarm signal is given as the previously described kind of pulse signal train, the signal given to the logic circuit 74 is kept at the L level over the period in which the alarm signal is being input.

Consequently, by the alarm signal being delay controlled by the second rise delay circuit 73, the delay controlled alarm signal is given to the multiplexer 66 via the first rise delay circuit 71 and fall delay circuit 72 in order, as previously described, over the period in which the alarm signal is being input, and is output via the multiplexer 66. Further, the input of the alarm signal stops, and the signal given to the logic circuit 74 from the second rise delay circuit 73 is inverted to the H level, as a result of which the PWM signal generated under the previously described conditions is output via the multiplexer 66.

As a result of this, the alarm signal or the PWM signal is alternatively selected via the multiplexer 66 and externally output via the previously mentioned output transistor 38. In particular, the multiplexer 66, when the alarm signal is input thereinto, preferentially outputs the alarm signal in place of the PWM signal. Consequently, by detecting a signal externally output via the output transistor 38, it is possible, in normal time, to monitor the temperature of the IGBTs 14, 15, and 16 from the PWM signal. Also, it is possible, when an anomaly occurs, to determine the type of the anomaly from the alarm signal.

Herein, to add a further description of the delay control of the alarm signal by the first and second rise delay circuits 71 and 73 and the fall delay circuit 72, the alarm signal is generated when an anomalous drop of the previously described control voltage Vcc or an overcurrent of the IGBT 14 (15, 16) is detected in one of the drive circuits 3X, 3Y, and 3Z. Consequently, no alarm signal is ever emitted when the power converter is operating normally. Hence, the temperature signal output circuit 6 steadily generates a PWM signal responding to the temperature of the IGBT 14 (15, 16) and externally outputs the PWM signal via the multiplexer 66.

Figure 6:
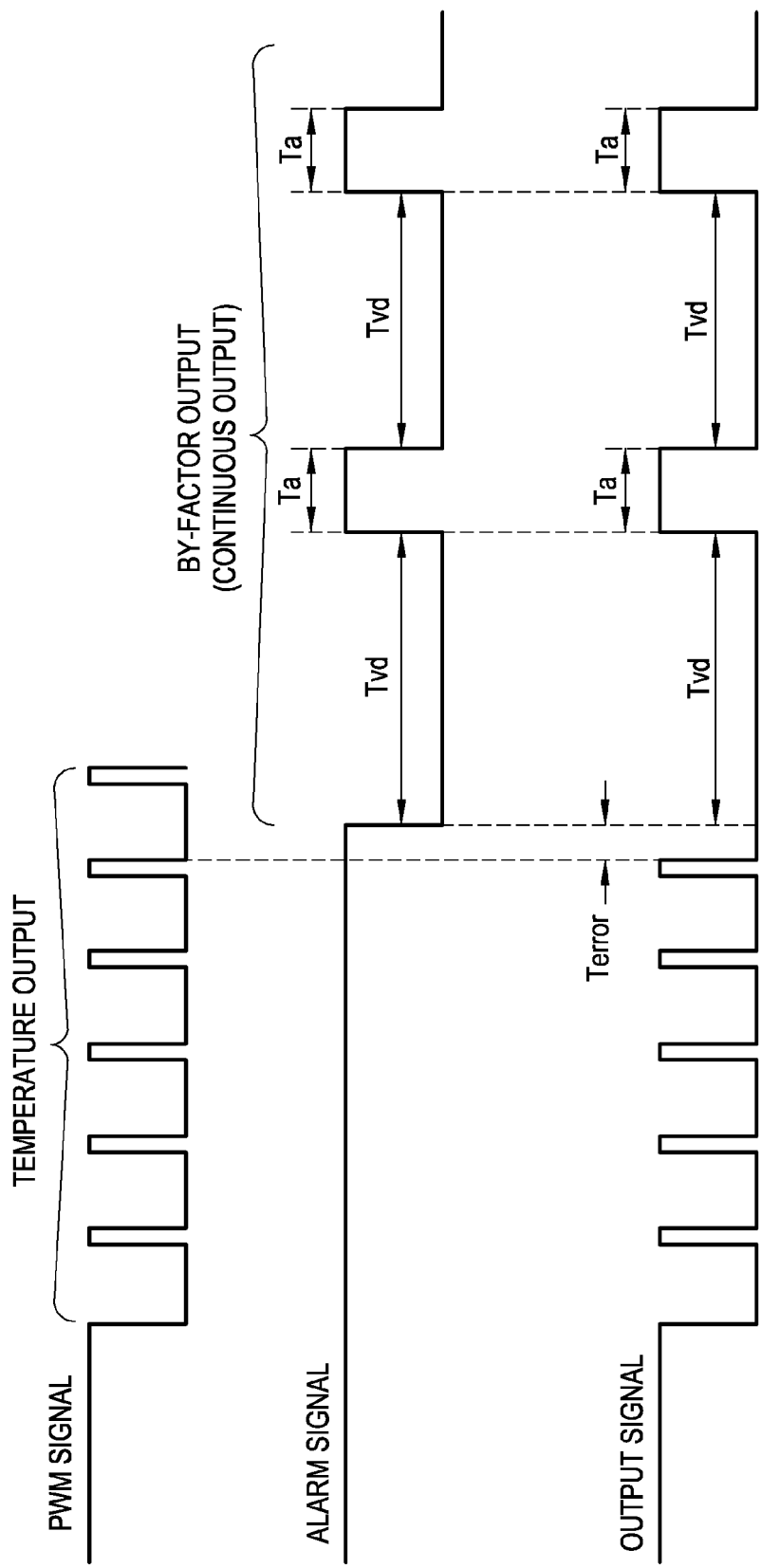
FIG. 6 is a signal waveform diagram for illustrating a problem when a PWM signal and an alarm signal are simply switched.

When one of the drive circuits 3X, 3Y, and 3Z emits an alarm signal in this kind of situation, the alarm signal is given to the temperature signal output circuit 6. Then, the temperature signal output circuit 6 selects and outputs the alarm signal, in place of the PWM signal, as a result of the input of the alarm signal, as previously described. At this time, when no delay control is executed on the alarm signal, the switch control of the multiplexer 66 is executed at the timing at which the alarm signal is input. As a result of this, there is fear that, following the switch control, the alarm signal is output with the PWM signal remaining at the L level, as shown in, for example, FIG. 6.

Then, at the point of switching from the PWM signal to the alarm signal, the L level of the PWM signal and the L level of the alarm signal overlap each other, and the initial pulse width of the alarm signal becomes apparently wider than the original pulse width Tvd. As a result of this, a gross error Terror occurs in measuring the pulse width of the alarm signal, thus causing a problem in determining the type of alarm signal based on the pulse width.

Figure 7:
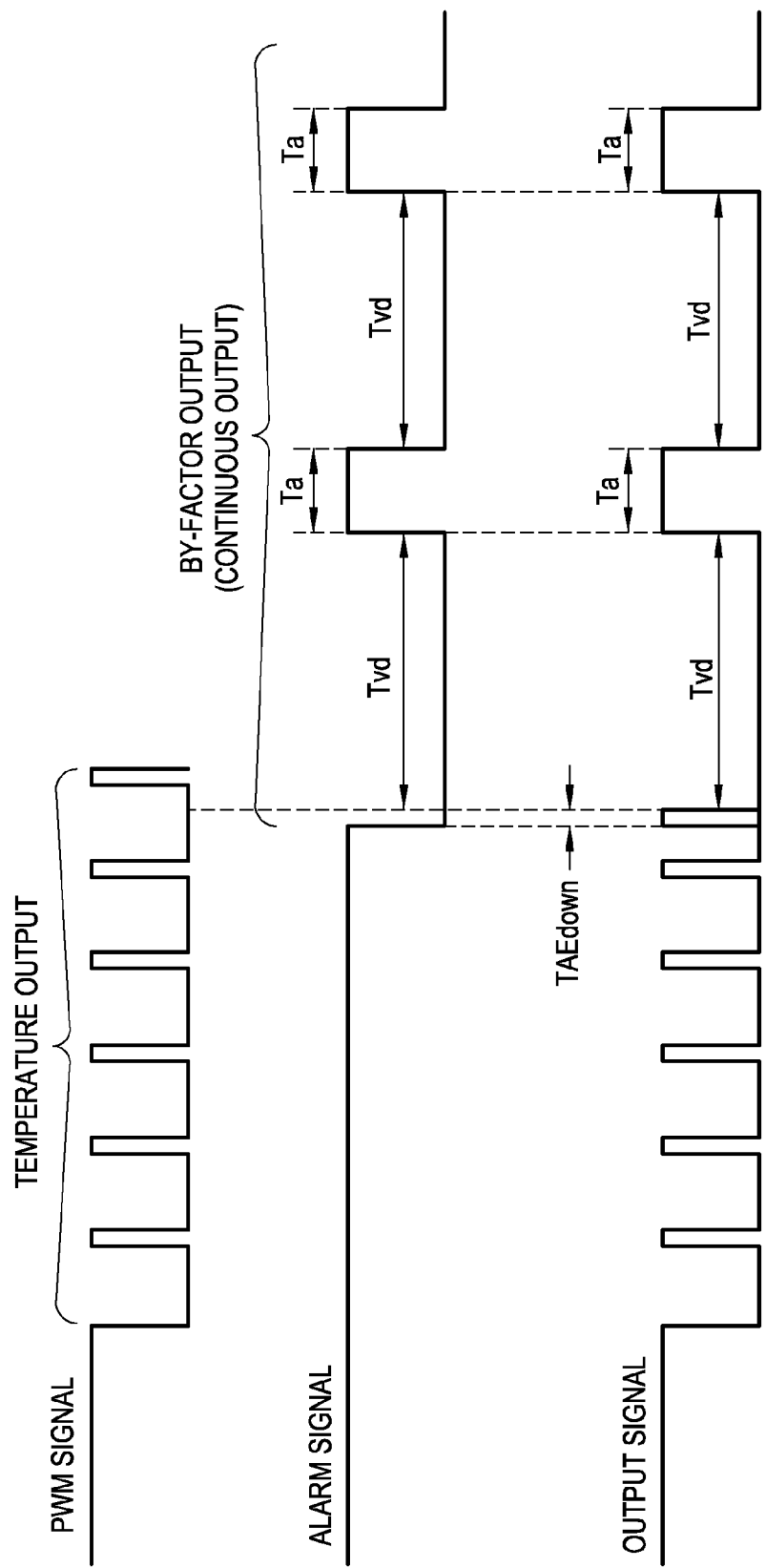
FIG. 7 is a signal waveform diagram when the PWM signal and alarm signal are switched in a signal in which the alarm signal is delayed.

In this respect, according to the delay control of the alarm signal, the previously described delay control is executed on the alarm signal input into the temperature signal output circuit 6. Therefore, after the switch control of the multiplexer 66 has been carried out at the timing at which the alarm signal has been input, an alarm signal delayed by the time TAEdown (=TAEup) is given to the multiplexer 66. As a result of this, the alarm signal delayed in the way previously described is obtained as the output of the multiplexer 66, as shown in FIG. 7. Consequently, it does not happen that the pulse width of the alarm signal output from the temperature signal output circuit 6 changes. Consequently, it is possible to accurately measure the pulse width of the alarm signal, and identify an anomaly factor of the alarm signal, on the side of the previously described inverter control section which monitors the alarm signal.

Thus, according to the heretofore described power converter control device, by utilizing an external output terminal of an alarm signal, it is possible, when detecting an anomaly of the IGBTs 14, 15, and 16, to output an alarm signal indicating the type of the anomaly in place of the PWM signal while steadily outputting information relating to the temperatures of the IGBTs 14, 15, and 16, which are semiconductor elements, as a PWM signal correlated with a highest temperature of the temperatures. Consequently, one common external output terminal can be used for the output terminal of the PWM signal and the output terminal of the alarm signal, and consequently, there is no need to increase the number of output terminals used in an IPM.

Moreover, by making the temperature information a PWM signal correlated with the temperature, and setting the cycle of the PWM signal to be shorter than the pulse width of the alarm signal, it is also possible to make it easy to distinguish between the PWM signal and the alarm signal. Consequently, it is easy to distinguish therebetween even though the PWM signal and the alarm signal are externally output using one common external output terminal. Consequently, no problem ever occurs in externally outputting each of the signals. Also, as it is possible to monitor a temperature anomaly of the semiconductor elements from the PWM signal, no problem occurs in this respect either. Consequently, the practical advantage of the power converter control device is immense.

The invention is not limited to the heretofore described embodiment. For example, in place of providing the dedicated temperature signal output circuit 6 illustrated in the embodiment, it is also possible to mount a circuit function which generates the PWM signal in response to a temperature detected via the temperature detection diode 18, and a circuit function which selectively outputs the PWM signal or alarm signal, in each of the plurality of drive circuits 3U to 3Z.

Also, as described above, the multiplexer 66 is switch controlled in accordance with whether the alarm signal is input or not, but it is also possible to switch control the multiplexer 66 utilizing, for example, the previously described protection signal Sp. Apart from this, the invention can be variously modified and implemented without departing from the scope thereof.

The invention claimed is:

1. A power converter control device, comprising:
a drive circuit configured to drive a semiconductor element;
a plurality of protection circuits, each of the plurality of protection circuits being configured to detect information corresponding to a protection operation of the semiconductor element, to generate a protection signal, and, in accordance with the protection signal, stop the drive of the semiconductor element by the drive circuit;
an alarm signal generation circuit configured to, in response to an output of each of the plurality of protection circuits, generate an alarm signal with a pulse width corresponding to a protection factor of the semiconductor element, and to output the alarm signal;
a temperature signal generation circuit configured to detect a temperature of the semiconductor element, and to generate a pulse width modulated (PWM) signal, correlated with the temperature, the cycle of the PWM signal being different from the pulse width of the alarm signal; and
an output control circuit configured to select and output the alarm signal instead of the PWM signal when the alarm signal is generated.

2. The power converter control device according to claim 1, wherein each of the plurality of protection circuits comprises a voltage detection circuit configured to detect a control voltage applied to the control device, a temperature detection circuit configured to detect a temperature of the semiconductor element, and a current detection circuit configured to detect a current flowing through the semiconductor element, and to generate respective protection signals for low voltage protection, overheat protection, and overcurrent protection.

3. The power converter control device according to claim 1, wherein the temperature signal generation circuit is configured to generate the PWM signal only if the temperature of the semiconductor element is equal to or higher than a set temperature.

4. The power converter control device according to claim 1, wherein the temperature signal generation circuit is configured to generate the PWM signal while defining at least one of the upper limit or the lower limit of a duty of the PWM signal.

5. The power converter control device according to claim 1, wherein the output control circuit comprises a multiplexer configured to select and output the alarm signal when the alarm generation circuit generates the alarm signal, and to select and output the PWM signal when the generation of the alarm signal stops.

6. A power converter control device, comprising:
   a plurality of drive circuits that drive a plurality of semiconductor elements, respectively;
   a plurality of protection circuits corresponding to the plurality of semiconductor elements, respectively, each of the plurality of protection circuits being configured to detect information corresponding to a protection operation of each of the plurality of semiconductor elements, to generate a protection signal, and, in accordance with the protection signal, stop the drive of the semiconductor element by the drive circuit;
   alarm signal generation circuits corresponding to the plurality of semiconductor elements, respectively, each of the alarm signal generation circuits configured to, in response to an output of each corresponding protection circuit, generate and output an alarm signal with a pulse width corresponding to a protection factor;
   temperature signal generation circuits configured to detect a temperature of each of the plurality of semiconductor elements, respectively, and to generate a pulse width modulated (PWM) signal, correlated with the temperature, the cycle of the PWM signal being different from the pulse width of the alarm signal; and
   output control circuits configured to select and output the alarm signal instead of the PWM signal when the alarm signal is generated.

7. The power converter control device according to claim 6, wherein each of the plurality of protection circuits comprises a voltage detection circuit configured to detect a control voltage applied to the control device, a temperature detection circuit configured to detect a temperature of the semiconductor element, and a current detection circuit configured to detect a current flowing through the semiconductor element, and to generate respective protection signals for low voltage protection, overheat protection, and overcurrent protection.

8. The power converter control device according to claim 6, wherein each of the temperature signal generation circuits is configured to generate the PWM signal only if the temperature of the respective semiconductor element is equal to or higher than a set temperature.

9. The power converter control device according to claim 6, wherein each of the temperature signal generation circuits is configured to generate the PWM signal while defining at least one of the upper limit or the lower limit of a duty of the PWM signal.

10. The power converter control device according to claim 6, wherein each of the output control circuits comprises a multiplexer configured to select and output the alarm signal when the alarm generation circuit generates the alarm signal, and to select and output the PWM signal when the generation of the alarm signal stops.

11. The power converter control device according to claim 10, wherein the multiplexer is configured to select and output the PWM signal in accordance with a switching signal generated by delaying the trailing edge of the alarm signal.

12. The power converter control device according to claim 6, wherein each of the plurality of drive circuits are formed into integrated circuits with the plurality of respective protection circuits and alarm signal generation circuits corresponding to the plurality of respective semiconductor elements, and
   the temperature signal generation circuit is formed into an integrated circuit with the output circuit independently from the plurality of drive circuits.

13. The power converter control device according to claim 12, wherein the temperature signal generation circuit is configured to select the highest temperature of a plurality of the detected temperatures and to generate a PWM signal correlated with the highest temperature.

* * * * *